US009129684B2

(12) United States Patent
Vali et al.

(10) Patent No.: US 9,129,684 B2
(45) Date of Patent: Sep. 8, 2015

(54) DYNAMIC PROGRAM WINDOW DETERMINATION IN A MEMORY DEVICE

(71) Applicant: MICRON TECHNOLOGY, INC., Boise, ID (US)

(72) Inventors: Tommaso Vali, Sezze (IT); Giovanni Santin, Rieti (IT); Massimo Rossini, Rome (IT); William H. Radke, Los Gatos, CA (US); Violante Moschiano, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/538,020

(22) Filed: Nov. 11, 2014

(65) Prior Publication Data

US 2015/0063031 A1  Mar. 5, 2015

Related U.S. Application Data

(62) Division of application No. 13/190,911, filed on Jul. 26, 2011, now Pat. No. 8,902,648.

(51) Int. Cl.
*G11C 11/34* (2006.01)
*G11C 16/10* (2006.01)
*G11C 11/56* (2006.01)
*G11C 16/34* (2006.01)
*G11C 16/26* (2006.01)

(52) U.S. Cl.
CPC ............. *G11C 16/10* (2013.01); *G11C 11/5628* (2013.01); *G11C 16/26* (2013.01); *G11C 16/34* (2013.01); *G11C 16/3418* (2013.01)

(58) Field of Classification Search
CPC ........... G11C 16/3404; G11C 16/3418; G11C 16/3486

USPC ........................ 365/185.03, 200, 201, 185.24
See application file for complete search history.

(56) References Cited

U.S. PATENT DOCUMENTS

| 7,656,710 | B1 | 2/2010 | Wong |
| 2008/0310224 | A1 | 12/2008 | Roohparvar et al. |
| 2009/0097311 | A1 | 4/2009 | Roohparvar et al. |
| 2009/0106482 | A1 | 4/2009 | Sarin et al. |
| 2011/0013450 | A1 | 1/2011 | Murin et al. |
| 2012/0195123 | A1* | 8/2012 | Lee ........................... 365/185.12 |
| 2013/0155769 | A1 | 6/2013 | Li et al. |
| 2014/0003152 | A1 | 1/2014 | Sharon |

OTHER PUBLICATIONS

Park et al., "CFLRU: A Replacement Algorithm for Flash Memory," KAIST Department of Computer Science, Jan. 31, 2006.

* cited by examiner

*Primary Examiner* — Han Yang
(74) *Attorney, Agent, or Firm* — Dicke, Billig & Czaja, PLLC

(57) ABSTRACT

A memory device has an array of memory cells and a controller coupled to the array of memory cells. The controller is configured to determine a program window after a portion of a particular programming operation performed on the memory device is performed and before a subsequent portion of the particular programming operation performed on the memory device is performed. The controller is configured to determine the program window responsive to an amount of program disturb experienced by a particular state of a memory cell. The controller is configured to perform the subsequent portion of the particular programming operation performed on the memory device using the determined program window.

20 Claims, 4 Drawing Sheets

DYNAMIC PROGRAM WINDOW DETERMINATION IN A MEMORY DEVICE

RELATED APPLICATION

This application is a divisional of U.S. patent application Ser. No. 13/190,911, titled, "DYNAMIC PROGRAM WINDOW DETERMINATION IN A MEMORY DEVICE," filed Jul. 26, 2011 (allowed), which is commonly assigned and incorporated in its entirety herein by reference.

TECHNICAL FIELD

The present disclosure relates generally to semiconductor memory and more particularly to programming memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile/flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Each cell in a non-volatile memory device can be programmed as a single bit per cell (i.e., single level cell—SLC) or multiple bits per cell (i.e., multilevel cell—MLC). Each cell's threshold voltage ($V_t$) determines the data that is stored in the cell. For example, in an SLC memory, a $V_t$ of 0.5V might indicate a programmed cell while a $V_t$ of −0.5V might indicate an erased cell. The MLC has multiple positive $V_t$ ranges that each indicates a different state whereas a negative $V_t$ range typically indicates an erased state. An MLC memory can take advantage of the analog nature of a traditional flash cell by assigning a bit pattern to a specific voltage range stored on the cell. The collection of different $V_t$ ranges (each of which representing a different programmable state) together are part of a fixed program window that encompasses the fixed voltage range over which a memory device is programmable. Each of the ranges are separated by a voltage space ("margin") that is relatively small due to the limitations of fitting a number of states into the program window of a typical low voltage memory device.

FIG. 1 illustrates a typical fixed program window 100 of a non-volatile memory device. The illustrated program window 100 encompasses six programmable states L1-L6 such that the distributions 102-107 for all the programmable states fit within the program window 100 (as used herein, a "distribution" for a state refers to a number of cells having a $V_t$ within the particular range of $V_t$'s corresponding to that state). The program window 100 for a memory device is determined during manufacture of the device as a result of an engineering assessment. The assessment determines a maximum $V_t$ of the erased state distribution L0 101 and a minimum $V_t$ of the "highest" distribution L7 108. The state L7 corresponding to the highest range of $V_t$'s may not be used due to the relatively large voltages required to program this state and/or the program disturb that can result from these programming voltages, in which case it is excluded from the fixed program window 100, as illustrated in FIG. 1.

One problem with a fixed program window is that the programming characteristics (maximum programmable voltage, number of programming pulses required, speed of programming) of a memory device typically change as the memory experiences an increasing number of program/erase cycles. Also, the programming characteristics can vary between memory dies as well as between memory blocks and/or pages of each memory die.

For the reasons stated above, and for other reasons stated below which will become apparent to those skilled in the art upon reading and understanding the present specification, there is a need in the art for a way to dynamically determine a program window in a memory device.

DETAILED DESCRIPTION

Figure 1:
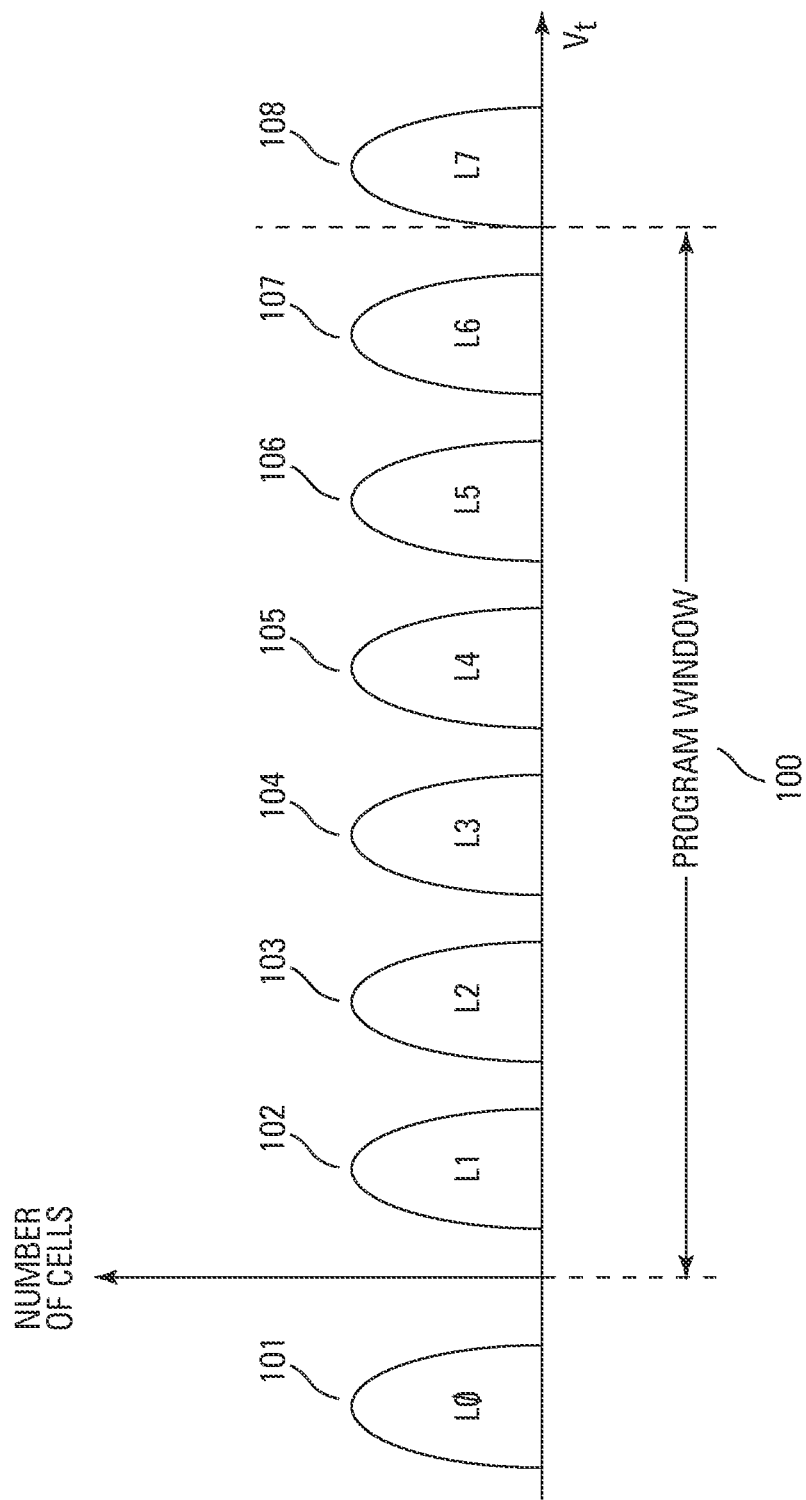
FIG. 1 shows a typical prior art fixed program window encompassing programmable states.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
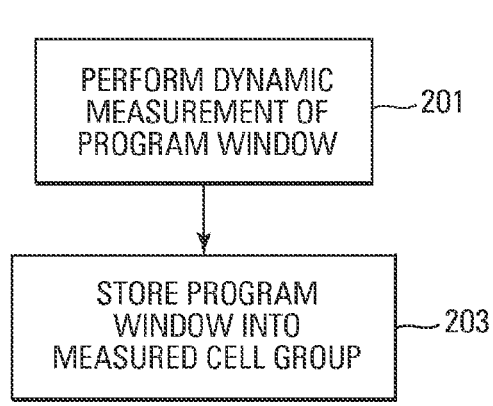
FIG. 2 shows a flowchart of one embodiment of a method for dynamically determining a program window.
Figure 3:
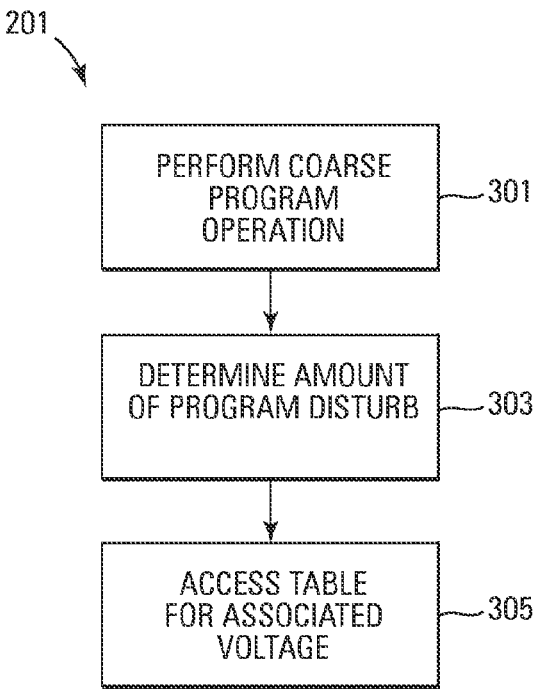
FIG. 3 shows a flowchart of one embodiment of a method for determining a program window in accordance with the method of FIG. 2.
Figure 4:
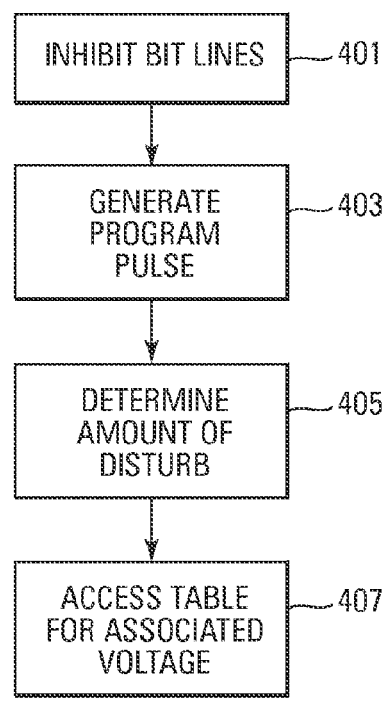
FIG. 4 shows a flowchart of another embodiment of a method for determining a program window in accordance with the method of FIG. 2.

FIG. 2 illustrates a flowchart of one embodiment of a method for dynamically determining a program window in a memory device. A measurement is first performed to determine the width of the program window 201. This measurement can be done in many different ways. FIGS. 3 and 4 illustrate two embodiments of performing this measurement.

The embodiments of FIGS. 3 and 4 are based on a measurement of an amount of program disturb experienced by one of the states (e.g., L0, erased state). The amount of program disturb corresponds to a certain program window (e.g., in Volts). Thus, once the amount of program disturb is determined, the corresponding program window can be determined through, for example, accessing a table with the amount of program disturb.

The program window measurement is performed dynamically unlike the prior art that determines the program window once such as during manufacture or design of the memory device. The present embodiment can perform this determination during each program cycle so that, as the memory device programming characteristics change in response to an increasing number of program/erase cycles, as well as other factors, the program window can be adjusted to track the changing programming characteristics.

In one embodiment, the program window determination is performed during each program operation. Other embodiments can perform the determination periodically after a particular number of program operations. Still other embodiments can perform the determination aperiodically. In one such embodiment, the frequency of determinations is increased as the memory device experiences a greater number of program/erase cycles. In another aperiodic embodiment, the frequency of determinations is decreased as the memory device experiences a greater number of program/erase cycles.

In one embodiment, a new program window is determined for a certain grouping of memory cells (e.g., page, block, array). Thus, each memory cell group can be associated with (e.g., assigned) a different program window since the programming characteristics can vary from page to page and block to block.

After the new program window has been measured 201, an indication of the program window is stored within the measured memory cell group 203. The newly determined program window is thus associated with the memory cell group to which it applies.

FIG. 3 illustrates a flowchart of one embodiment for dynamically determining the program window 201 in accordance with the method of FIG. 2. This embodiment performs the determination after a coarse programming operation and before the fine programming begins. Thus, the new program window can then be used during the fine programming operation.

As is known in the art, a coarse programming operation initially moves a threshold voltage of memory cells being programmed more quickly by biasing an access line (e.g., word line) coupled to control gates of the memory cells with a program voltage ($V_{pgm}$) that is increased with a relatively large step voltage. After the threshold voltage has either reached a target threshold voltage or is moved to within a certain distance of the target threshold voltage, the coarse programming is ended and fine programming is performed. The fine programming uses a smaller step voltage to more slowly increase the program voltage in order to "fine tune" the threshold voltage and get it closer to the target threshold voltage without over-programming the memory cell. An over-programmed memory cell has a threshold voltage that exceeds the target threshold voltage.

The dynamic program window measurement method of FIG. 3 initially performs a coarse program operation 301. During this operation, some of the memory cells are inhibited from programming and are thus held in an initial state (e.g., L0). However, these inhibited memory cells can still experience a program disturb condition that can affect their respective current states. After the coarse program operation has been completed, an amount of program disturb experienced by the memory cells that are still in the particular state (e.g., L0) is determined.

Figure 5:
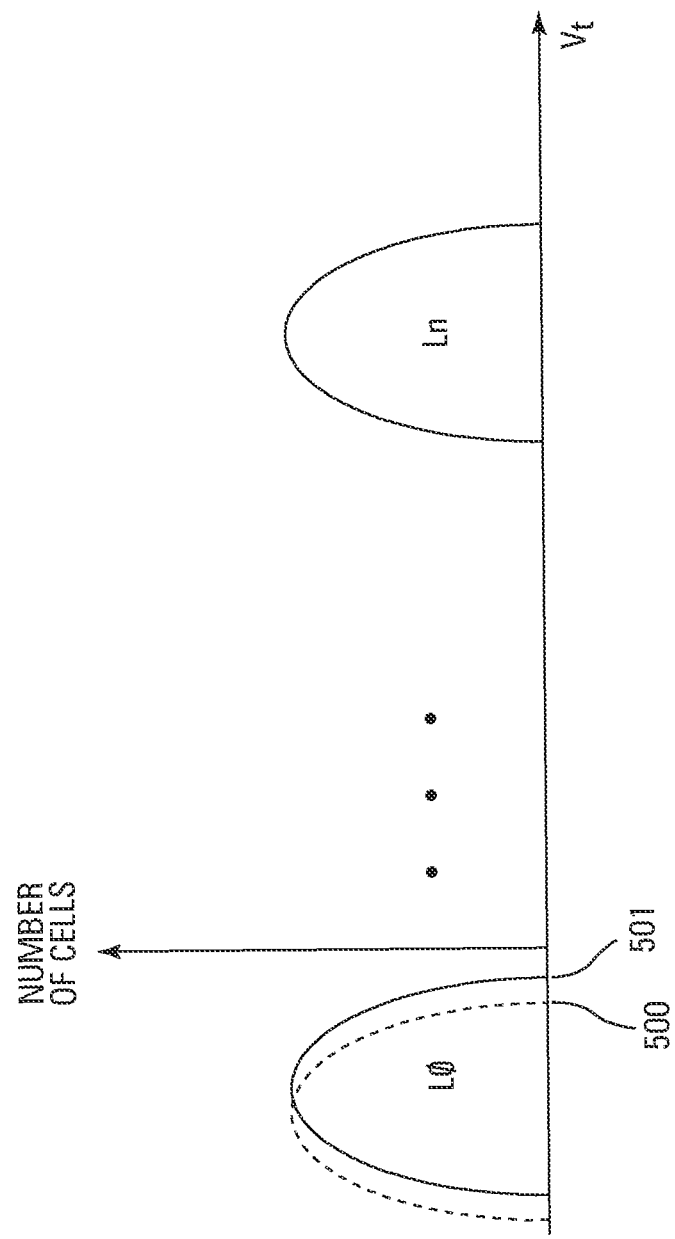
FIG. 5 shows a diagram of the effect of program disturb on an L0 distribution.

Referring now to FIG. 5, after the coarse programming has been completed, it is possible to read all of the cell's threshold voltages ($V_t$) and store their values into a page buffer of the array. It is also possible to define a specific threshold level (e.g., a delta above the maximum $V_t$ 500 of the range of $V_t$'s corresponding to the initial state L0 500, so that the number of L0 bits above the threshold before coarse programming is zero). After the coarse programming, a controller can determine the number of cells of the final L0 distribution 501 with a $V_t$>threshold. This number is a measure of how much their threshold voltages have increased due to the program disturb.

The change in the particular state (e.g., L0) (e.g., program disturb) can then be used to access a table to determine an associated program window 305 (e.g., program window width). This width can be represented by a voltage or a digital indication of a voltage. In one embodiment, the table includes representations of the change in the particular state each with an associated program window width. In another embodiment, the table includes a representation of the upper end of the final particular state (e.g., L0) with an associated program window width.

FIG. 4 illustrates a flowchart of another embodiment for performing the dynamic determination of the program window 201 as discussed above with reference to FIG. 2. This embodiment is performed prior to any coarse programming or lower page programming of the group of memory cells to be programmed.

All of the data lines (e.g., bit lines) that are coupled to the group of memory cells being programmed are biased with an inhibit voltage 401 (e.g., $V_{CC}$ or supply voltage). A programming pulse is then applied to the word lines 403 that are coupled to the control gates of memory cells of the group of memory cells being programmed. Since the memory cells are inhibited from being programmed, the programming pulse can be considered a dummy programming pulse in that the memory cells cannot be programmed in response to this pulse. However, the memory cells can experience the program disturb condition as a result of this programming pulse. The amount of program disturb experienced by a particular state (e.g., L0) is then determined 405. The amount of disturb can be used to determine an associated program window. For example, the amount of disturb can be used to access a table for an associated program window width (e.g., voltage) 407.

The amount of program disturb of the embodiment of FIG. 4 can be determined substantially similar to the process used in the embodiment of FIG. 3. Additionally, the embodiment of FIG. 4 can also be in the digital domain or the analog domain.

As described previously with reference to FIG. 2, an indication of the program window that was determined from the amount of program disturb can be stored in the group of memory cells to which the window applies. For example, if a page of memory cells is being programmed, the indication of the associated program window can be stored in the same page. Thus, when the page is being read after the programming operation, the indication of the associated program window can also be read to assist in the read operation. For example, using the indication of the program window associated with the page being read, the controller can then determine a respective voltage range in which each of the programmed states are located.

The method for dynamically determining a programming window can also be used as a form of wear leveling routine of a memory device. As is known in the art, pages and/or blocks of memory cells of a memory device can experience different amounts of program/erase cycles. Typical prior art wear leveling routines move data around the pages and/or blocks of memory cells and control the logical addressing of memory cells to attempt to equally distribute memory cell access so that the no one page and/or block is overused.

The dynamic determination of the programming window for each page and/or block of memory enables a controller (e.g., on die control circuitry or an external controller chip) to track the program window for the page and/or block of memory as the window degrades. The controller can move the data around to other memory pages and/or memory blocks based on their respective program windows. When a page and/or block of memory has a program window that has degraded to the point where it can no longer be used, that particular page and/or block of memory can be flagged as unusable. In one embodiment, the controller might flag the page and/or block of memory to operate in an SLC mode instead of an MLC mode, assuming the program window is still wide enough to be used to store a single state. The density could have a range of degradations (e.g., 3 bits per cell, 2 bits per cell, SLC). The dynamic adjustment can be more efficient. In another embodiment, the method for dynamic determination of the programming window can be used to sort data into different pages. For example, the importance of data can be compared to the resiliency of the underlying block. The more important data can be moved to stronger blocks/pages as a part of the block cleanup activities.

Figure 6:
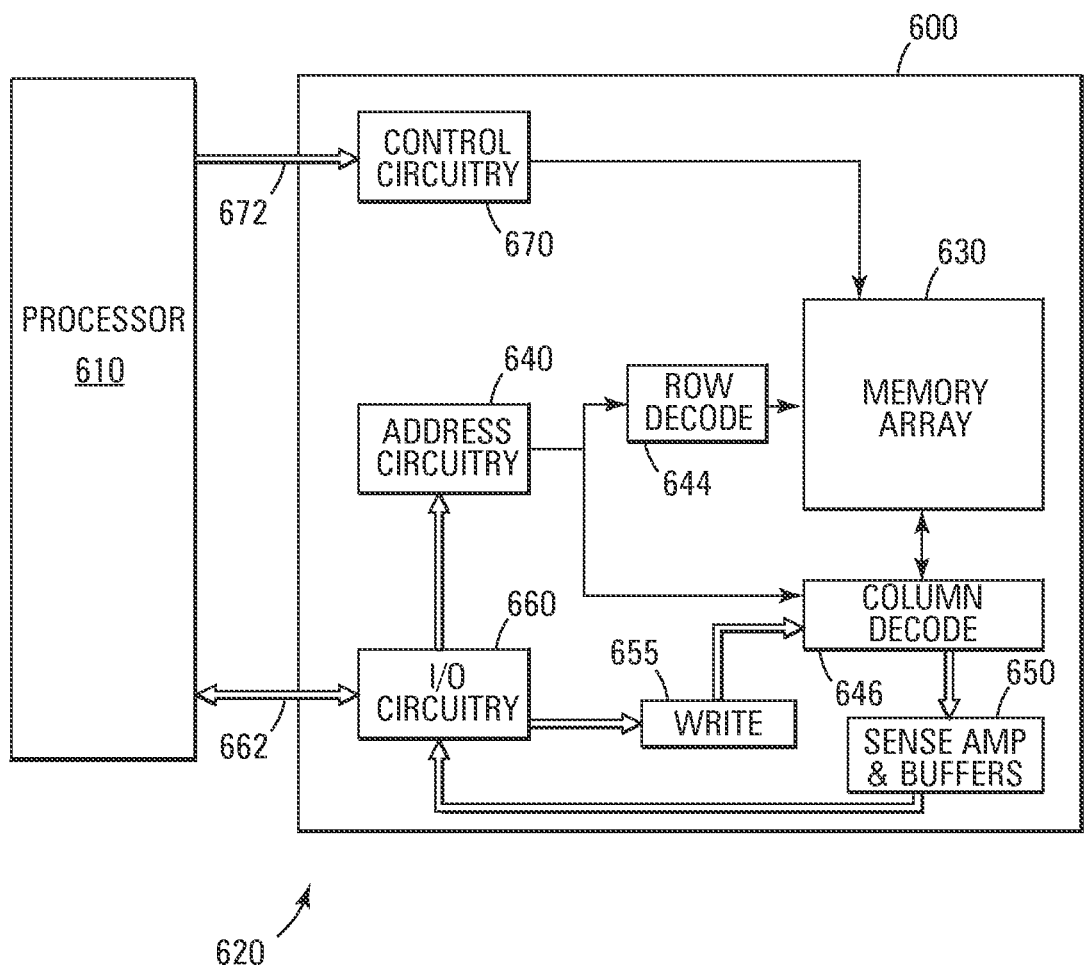
FIG. 6 shows a block diagram of one embodiment of a memory system incorporating the method for dynamic program window determination of the present disclosure.

FIG. 6 illustrates a functional block diagram of a memory device 600 that can incorporate the memory cells of the present invention. The memory device 600 is coupled to a processor 610. The processor 610 may be memory controller, a microprocessor or some other type of controlling circuitry. The memory device 600 and the processor 610 form part of a memory system 620. The memory device 600 has been simplified to focus on features of the memory that are helpful in understanding the present invention.

The memory device includes an array of non-volatile memory cells 630 that can be flash memory cells or other types of non-volatile semiconductor cells. The memory array 630 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture. The memory cells of the present invention can be arranged in either a NAND or NOR architecture, as described previously, as well as other architectures.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense amplifier/buffer circuitry 650. The sense amplifier/buffer circuitry, in one embodiment, is coupled to read and latch a row of data from the memory array 630. Data input and output buffer circuitry 660 is included for bi-directional data communication over a plurality of data connections 662 with the controller 610. Write circuitry 655 is provided to write data to the memory array.

Control circuitry 670 decodes signals provided on control connections 672 from the processor 610. These signals are used to control the operations on the memory array 630, including data read, data write, and erase operations. The control circuitry 670 may be a state machine, a sequencer, or some other type of controller. The control circuitry 670 is adapted to perform the programming window adjustment embodiments disclosed previously. The control circuitry 670 can be part of the memory device 600 as shown or separate from the memory device 600.

The flash memory device illustrated in FIG. 6 has been simplified to facilitate a basic understanding of the features of the memory and is for purposes of illustration only. A more detailed understanding of internal circuitry and functions of flash memories are known to those skilled in the art.

CONCLUSION

In summary, one or more embodiments of the present disclosure dynamically determine a program window for each page and/or block of memory. The program window can be determined during each programming operation by determining an amount of program disturb experienced by a particular state and using that amount of program disturb to determine the program window.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is intended that this invention be limited only by the following claims and equivalents thereof.

What is claimed is:

1. A memory device, comprising:
   an array of memory cells; and
   a controller coupled to the array of memory cells;
   wherein the controller is configured to determine a program window after a portion of a particular programming operation performed on the memory device is performed and before a subsequent portion of the particular programming operation performed on the memory device is performed;
   wherein the controller is configured to determine the program window responsive to an amount of program disturb experienced by a particular state of a memory cell; and
   wherein the controller is configured to perform the subsequent portion of the particular programming operation performed on the memory device using the determined program window.

2. The memory device of claim 1, wherein the controller is configured to determine a program window after performing a portion of each programming operation performed on the memory device.

3. The memory device of claim 1, wherein the controller is further configured to store the determined program window in an associated group of memory cells being programmed.

4. The memory device of claim 1, wherein the controller is further configured to access a table with the amount of program disturb to determine the program window.

5. The memory device of claim 1, wherein the controller is further configured to perform a read operation using the determined program window.

6. The memory device of claim 1, wherein the array of memory cells is configured into groups of memory cells wherein a group of memory cells is associated with a respective program window.

7. The memory device of claim 1, wherein the controller is further configured to move data to different memory pages and/or memory blocks responsive to their respective program windows.

8. The memory device of claim 7, wherein the controller is further configured to compare an importance of data with a resiliency of an underlying block, wherein data having more importance is moved to stronger blocks or pages as a part of a block cleanup activity.

9. The memory device of claim 7, wherein the controller is further configured to determine when the respective program window for a particular memory page and/or memory block has degraded such that the memory page and/or memory block is unusable.

10. The memory device of claim 7, wherein the controller is further configured to determine when the respective program window for a particular memory page and/or memory block has degraded such that the memory page and/or memory block can only be used in an SLC mode.

11. The memory device of claim 1, wherein the particular state of the memory cell is an erased state of the memory cell.

12. The memory device of claim 1, wherein the controller is further configured to measure the amount of program disturb experienced by the particular state of the memory cell.

13. A memory device, comprising:
an array of memory cells; and
a controller coupled to the array of memory cells;
wherein the controller is configured to perform a particular programming operation on a group of memory cells of the memory device;
wherein the controller is configured to determine a program window after a portion of the particular programming operation is performed on the group of memory cells of the memory device and before a subsequent portion of the particular programming operation performed on the group of memory cells of the memory device is performed;
wherein the controller is configured to determine the program window responsive to an amount of program disturb experienced by a particular state of a memory cell of the group of memory cells of the memory device;
wherein the controller is configured to store an indication of the program window in the group of memory cells; and
wherein the controller is configured to perform the subsequent portion of the particular programming operation performed on the group of memory cells of the memory device using the determined program window.

14. The memory device of claim 13, wherein the portion of the particular programming operation after which the program window is determined comprises coarse programming.

15. The memory device of claim 14, wherein the subsequent portion of the particular programming operation comprises fine programming.

16. The memory device of claim 13, wherein the controller is configured to access a table with the amount of program disturb to determine the program window.

17. The memory device of claim 13, wherein the indication of the program window comprises a voltage or indication of a voltage representing a width of the program window.

18. The memory device of claim 13, wherein the controller is configured to determine the amount of program disturb by determining a difference between an initial distribution of the particular state of the memory cell prior to the portion of the particular programming operation after which the program window is determined and a final distribution of the particular state of the memory cell after the portion of the particular programming operation after which the program window is determined.

19. A memory device, comprising:
an array of memory cells; and
a controller coupled to the array of memory cells;
wherein the controller is configured to determine a program window after a portion of a particular programming operation performed on the memory device is performed and before a subsequent portion of the particular programming operation performed on the memory device is performed,
wherein the controller is configured to determine the program window responsive to an amount of program disturb experienced by a particular state of a memory cell that is inhibited during the portion of the particular programming operation after which the program window is determined; and
wherein the controller is configured to perform the subsequent portion of the particular programming operation performed on the memory device using the determined program window.

20. The memory device of claim 19, wherein the particular state of the memory cell that is inhibited during the portion of the particular programming operation after which the program window is determined is an erased state of that memory cell.

* * * * *